United States Patent
Ikemoto (10) Patent No.: US 9,369,640 B2
(45) Date of Patent: Jun. 14, 2016

(54) IMAGING DEVICE AND IMAGING APPARATUS

(71) Applicant: CANON KABUSHIKI KAISHA, Tokyo (JP)

(72) Inventor: Kiyokatsu Ikemoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 100 days.

(21) Appl. No.: 14/018,072

(22) Filed: Sep. 4, 2013

(65) Prior Publication Data

US 2014/0071319 A1    Mar. 13, 2014

(30) Foreign Application Priority Data

Sep. 12, 2012 (JP) ................. 2012-200133

(51) Int. Cl.

| | |
|---|---|
| *H04N 5/335* | (2011.01) |
| *H04N 5/369* | (2011.01) |
| *G02B 7/34* | (2006.01) |
| *G01C 3/08* | (2006.01) |
| *G03B 35/08* | (2006.01) |
| *G03B 9/02* | (2006.01) |

(52) U.S. Cl.
CPC ................. *H04N 5/335* (2013.01); *G01C 3/08* (2013.01); *G02B 7/34* (2013.01); *G03B 35/08* (2013.01); *H04N 5/3696* (2013.01); *G03B 9/02* (2013.01)

(58) Field of Classification Search
CPC . H04N 5/23212; H04N 5/3696; H04N 9/045; H04N 5/2351; H04N 5/243; H04N 5/335; H04N 13/0239; H04N 5/37457; H04N 13/0271

USPC .............. 348/335, 340, 345, 348, 350, 352
See application file for complete search history.

(56) References Cited

U.S. PATENT DOCUMENTS

| | | | | |
|---|---|---|---|---|
| 8,319,882 | B2 * | 11/2012 | Fujii ...................... | G02B 7/28 |
| | | | | 348/343 |
| 2007/0206940 | A1 * | 9/2007 | Kusaka .................. | 396/128 |
| 2011/0199521 | A1 * | 8/2011 | Kato et al. ............... | 348/294 |
| 2013/0277541 | A1 | 10/2013 | Ikemoto et al. | |

FOREIGN PATENT DOCUMENTS

JP        2009-158800 A        7/2009

* cited by examiner

*Primary Examiner* — Twyler Haskins
*Assistant Examiner* — Padma Haliyur
(74) *Attorney, Agent, or Firm* — Fitzpatrick, Cella, Harper & Scinto (57) ABSTRACT

An imaging device for photoelectric conversion includes a plurality of pixels receiving light fluxes from an exit pupil of an optical system. At least part of the pixels are ranging pixels, each including a plurality of photoelectric conversion sections configured to receive light fluxes from a plurality of pupil areas in the exit pupil and a waveguide formed by a core and a clad that guides the light fluxes to the photoelectric conversion section. At least some of the ranging pixels include respective attenuating members arranged in the clad at a position opposite to the photoelectric conversion sections corresponding to pupil areas containing a large number of light fluxes representing a large angle relative to the normal at the pixel center of the ranging pixel having the attenuating member with regard to the pupil division direction on the ranging pixel corresponding to the displacement direction of the pupil areas.

13 Claims, 6 Drawing Sheets

IMAGING DEVICE AND IMAGING APPARATUS

BACKGROUND OF THE INVENTION

1. Field of the Invention

The present invention relates to a solid-state imaging device. More particularly, the present invention relates to an imaging apparatus or the like to be used for a digital still camera or a digital video camera.

2. Description of the Related Art

Distance detection techniques for AF (automatic focus settings) are known in the field of digital still cameras and video cameras. With regard to distance detection techniques for AF, Japanese Patent Application Laid-Open No. 2009-158800 proposes a ranging device realized by making part of the pixels of an imaging device have a ranging function that allows the device to be capable of detecting the distance to a subject by way of a phase difference detection type process. With a phase difference detection type process, images of the light fluxes that pass through different areas on the pupil of the imaging optical system of an imaging device are compared to detect the distance to a subject by means of triangulation using 3D images. With such a device, the distance to the subject is effectively measured unlike conventional contrast detection type devices because the lens of the camera does not need to be moved for focusing. In other words, high speed and high accuracy AF setting operations as well as real-time auto-focusing during video shooting can be realized with such a device. The above-cited Japanese Patent Application Laid-Open No. 2009-158800 discloses a ranging pixel including a micro lens, a waveguide and a plurality of photoelectric conversion sections such that the waveguide and the plurality of conversion sections are arranged below the micro lens. By using such ranging pixels, light fluxes that pass through different areas on the pupil of the imaging optical system are respectively guided to corresponding photoelectric conversion sections to make it possible to measure the distance to a subject.

However, the arrangement described in Japanese Patent Application Laid-Open No. 2009-158800 is accompanied by a problem that the ranging accuracy is degraded in peripheral sections of the imaging device and also in instances where a large number of light fluxes enter ranging pixels with large incident angles such as when a very light imaging optical system is employed. Such light fluxes can easily be bound to higher order eigenmodes of a waveguide and propagated through the waveguide in a guided mode with a broadened electric field distribution to get to a plurality of photoelectric conversion sections in a pixel. Then, the light fluxes that pass through different pupil areas can hardly be selectively guided to different photoelectric conversion sections to consequently degrade the pupil division characteristic. As a result, the base line length of triangulation is apt to become short to consequently degrade the ranging accuracy.

In view of the above-identified problem, the object of the present invention is to provide an imaging device that can accurately conduct ranging operations in ranging conditions that involve a large number of light fluxes entering ranging pixels with large incident angles particularly if the pixel size is small and a ranging device or the like that is realized by using such an imaging device.

SUMMARY OF THE INVENTION

The present invention provides an imaging device including a plurality of pixels configured to receive light fluxes from an exit pupil of an optical system for forming an image of a subject and operate for photoelectric conversion, the plurality of pixels including a plurality of ranging pixels, each having a plurality of photoelectric conversion sections configured to receive respective light fluxes from a plurality of pupil areas displaced from each other in the exit pupil and operate for photoelectric conversion and a waveguide having a core and a clad for guiding the light fluxes to the respective photoelectric conversion sections, the plurality of ranging pixels including first ranging pixels, each having an attenuating member, the attenuating member of each of the first ranging pixels being arranged in the clad at a position located at the side opposite to the photoelectric conversion sections corresponding to pupil areas containing a large number of light fluxes representing a large angle relative to the normal at the pixel center of the first ranging pixel having the attenuating member with regard to the pupil division direction on the ranging pixel corresponding to the displacement direction of the pupil areas.

The present invention also provides an imaging apparatus including: an imaging device as defined above; and an optical system for forming an image of a subject on the imaging device.

Further features of the present invention will become apparent from the following description of exemplary embodiments with reference to the attached drawings.

So long as an imaging device according to the present invention is appropriately placed in position relative to an optical system, a highly accurate ranging operation can be executed in ranging conditions that involve a large number of light fluxes representing large incident angles due to the provision of the attenuating members. Particularly, if the pixel size is small, the present invention can realize a ranging device or the like that can highly accurately conduct raging operations.

DESCRIPTION OF THE EMBODIMENTS

An imaging device according to the present invention is configured by taking into consideration the characteristic that the light propagation state in a waveguide (guided mode) varies as a function of the incident angle of a light flux that enters the waveguide of a ranging pixel. More specifically, a waveguide and a plurality of photoelectric conversion sections are arranged in each ranging pixel and the waveguide is formed so as to represent an appropriate structure. Additionally, an attenuating member is arranged in the clad of the waveguide to attenuate part of the light that is made to enter the ranging pixel with a large angle and is propagated through the waveguide. With such an arrangement, the light fluxes that pass through different areas on the exit pupil of the imaging optical system can be selectively and efficiently guided to different corresponding photoelectric conversion sections and detected. The distance to any subject can be measured accurately by combining an imaging optical system and an imaging device according to the present invention. Assume a typical instance where the optical axis of an imaging optical system passes through a center section of an imaging device. An imaging device according to the present invention includes a plurality of pixels, at least part of which are ranging pixels, and each of the ranging pixels has a waveguide formed by a core and a clad, a plurality of photoelectric conversion sections and an attenuating member. The attenuating member of each of the ranging pixel is arranged in the clad and also at the center side of the imaging device in the pupil division direction on the ranging pixel that corresponds to the direction of displacements of a plurality of pupil areas that are displaced from each other in the exit pupil of the imaging optical system. More generally speaking, including instances where the optical axis of the imaging optical system does not pass through a center section of an imaging device according to the present invention, the imaging device includes a plurality of pixels that are configured to receive light fluxes from the exit pupil of the optical system and operate for photoelectric conversion when the imaging device is placed in position relative to the optical system for forming an image of a subject. At least part of the pixels of the imaging device are ranging pixels, each of which includes a plurality of photoelectric conversion sections that receive respective light fluxes from a plurality of pupil areas and operate for photoelectric conversion and a waveguide that is formed by a core and clad so as to guide the light fluxes to the photoelectric conversion sections. At least some of the ranging pixels further include respective attenuating members. The attenuating member of each of those ranging pixels is arranged in the clad located at the side opposite to the photoelectric conversion sections corresponding to the pupil areas containing a large number of light fluxes representing a large angle relative to the normal of the imaging device at the pixel center of the ranging pixel that includes the attenuating member and in the pupil division direction on the ranging pixel.

As a ranging device is provided with an imaging device according to the present invention as described above, information on the distance to a subject can be acquired by using the output signals of the ranging pixels and the distance to the subject can be measured highly accurately. An imaging apparatus such as a digital camera that is provided with such a ranging device can produce a high quality image of a subject.

Now, embodiments of ranging device and those of imaging apparatus realized by using an imaging device according to the present invention will be described below by referring to the accompanying drawings. Throughout the drawings, devices and components thereof that are functionally the same and identical are denoted by the same reference numbers and will not be described repeatedly.

(First Embodiment)

Figure 1A:
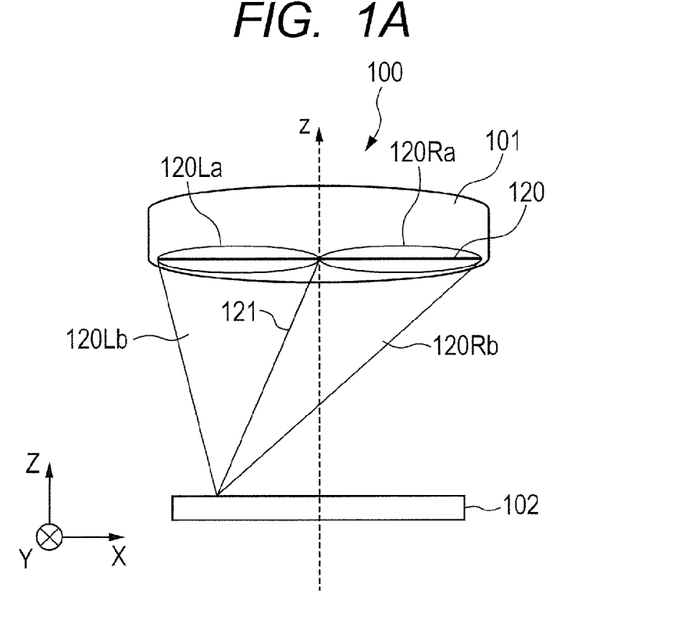
FIGS. 1A and 1B are schematic cross-sectional views of a ranging device formed by using an imaging device according to a first embodiment of the present invention.

With regard to the first embodiment of a ranging device 100 having an imaging device according to the present invention, an exemplar configuration of the ranging device 100 will be described below by referring to FIGS. 1A, 1B, 2A, 2B and 2C. Referring to firstly to FIG. 1A, the ranging device 100 of this embodiment includes an imaging optical system 101 and an imaging device 102. The imaging optical system 101 is an optical system that is non-telecentric on the image side.

Figure 1B:
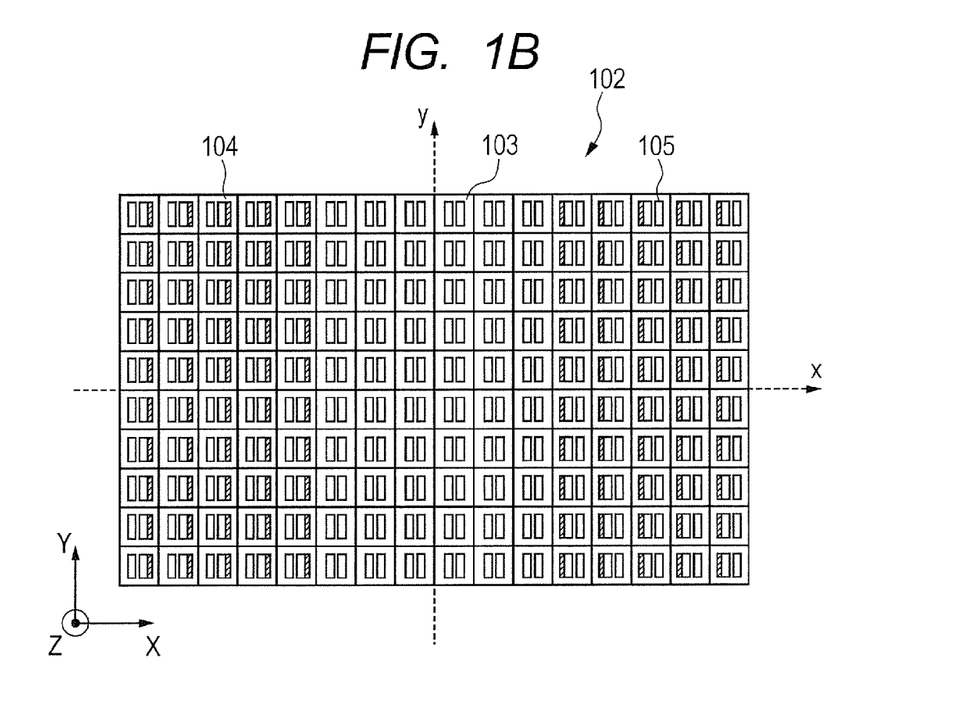
Figure 2A:
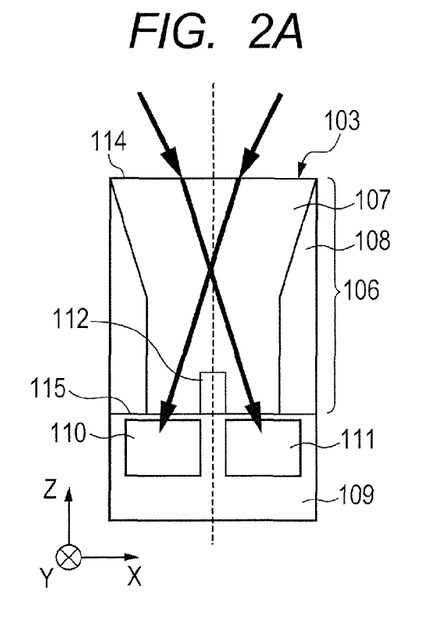
FIGS. 2A, 2B and 2C are schematic cross-sectional views of ranging pixels contained in the imaging device of the first embodiment.
Figure 2B:
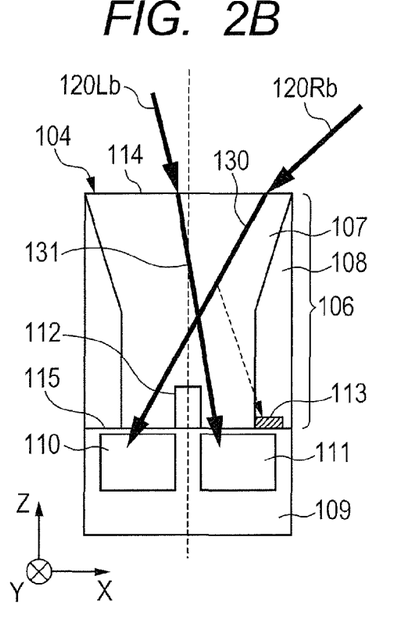
Figure 2C:
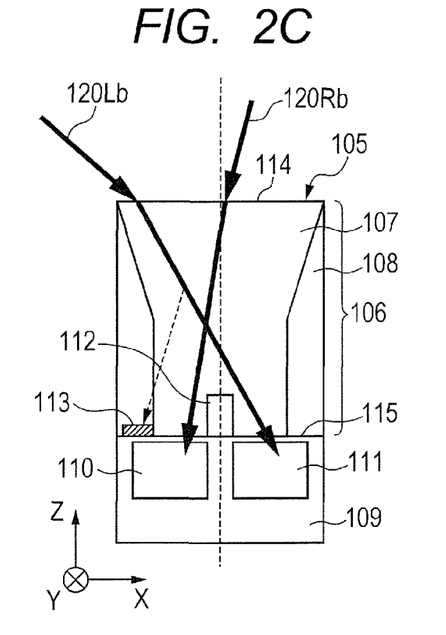

Pixels for acquiring information necessary for ranging are referred to as ranging pixels. As illustrated in FIG. 1B, the imaging device 102 includes a plurality of pixels including ranging pixels 103, 104 and 105. The ranging pixels 103 are arranged in a center section (an area where the optical axis of the imaging optical system 101 passes) of the imaging device 102, while the ranging pixels 104 and 105 are arranged in peripheral sections on the imaging device as viewed in the pupil division direction on the imaging device. Referring to FIGS. 2A, 2B and 2C, each of the ranging pixels 103, 104, 105 includes a waveguide 106 (a core 107, a clad 108 that surrounds the core 107) and a substrate 109 arranged in the above mentioned order as viewed from the light reception side of the pixel (+z side). Photoelectric conversion sections 110, 111 are formed in partial areas of the substrate 109. The substrate 109 is made of a material that absorbs light at the wavelength band to be detected by the pixels. A typical example of such a material is Si. The photoelectric conversion sections 110, 111 are formed typically by ion implantation at least in partial areas in the inside of the substrate so as to be located at the opposite sides relative to the pixel center. Differently stated, the middle position between the photoelectric conversion sections 110, 111 is referred to as pixel center. The core 107 and the clad 108 of the waveguide 106 are made of respective materials that are transparent at the wavelength band to be used for shooting operations. Examples of materials that can be used for the core 107 and the clad 108 include $SiO_2$, SiN and organic materials. The core 107 is made of a material whose refractive index is higher than the material of the clad 108.

Additionally, a scattering section 112 is formed in the core 107 of the waveguide 106 at the side of the light exit end 115. The scattering section 112 is formed by using a medium representing a refractive index smaller than the core 107. The scattering section 112 may typically be formed by using a medium same as that of the clad 108. The scattering member 112 is a member that disturbs part of the rays of light being propagated through the waveguide 106. The quantity of light that gets into the area between the photoelectric sections 110 and 111 can be reduced and the quantity of light that is forced to get into the areas where the photoelectric conversion sections 110 and 111 are located can be increased by arranging a scattering section 112.

The ranging pixels 103, 104, 105 are configured so as to acquire light fluxes coming from different pupil areas of the exit pupil of the optical system in the x-direction by means of the corresponding different photoelectric conversion sections 110, 111. Such a feature is referred to as pupil division feature and the direction in which the pupil is divided is referred to as pupil division direction. Furthermore, while the ranging pixels 103 arranged in a center section are not provided with any attenuating member, each of the ranging pixels 104 and 105 arranged in peripheral sections is provided with an attenuating member 113. The attenuating member 113 is arranged in the clad 108 and located at the center side of the imaging device 102 as viewed in the pupil division direction (x-direction in FIGS. 2B and 2C). The attenuating member 113 is formed by using a reflection medium that reflects at least part of the rays of light that hit the medium or an absorption medium that absorbs at least part of the rays of light that hit the medium. Examples of such mediums include Al, W and p-Si. Each of the pixels is provided with a wiring section (not illustrated) (that is electrically linked to the related photoelectric conversion sections).

(Ranging Principle)

As illustrated in FIG. 1A, the imaging optical system 101 forms an image of the outside thereof on the imaging device 102. The distance between the imaging optical system 101 and the imaging device 102 is long relative to the pixel size. For this reason, light fluxes 120Rb, 120Lb that pass through different respective areas 120Ra, 120La on the exit pupil 120 strike on the imaging device 102 with different respective incident angles. As light fluxes enter the respective waveguides 106 contained in the ranging pixels 103, 104, 105 of the imaging device 102, the transmission modes thereof are converted into respective guided modes and the light fluxes are propagated through the waveguides in the respective guided modes that are determined as a function of the incident angles of the light fluxes. A guided mode is expressed as the sum of a plurality of eigenmodes that a waveguide has. The guided mode of a waveguide tells the state of propagation of light in the waveguide. The eigenmodes of a waveguide are uniquely determined according to the shape and the refractive index of the core and those of the clad of the waveguide. The light fluxes that enter a waveguide are bound to a plurality of eigenmodes and propagated through the waveguide in the guided mode that is specific to the waveguide. The ratio of the eigenmodes that constitute the waveguide can vary according to incident angles of light fluxes and hence the electric field distribution of the guided mode can vary accordingly.

For each ranging pixel, the shape and the medium of the waveguide 106 are appropriately selected and the photoelectric conversion sections 110, 111 are arranged at appropriate respective positions. Then, as a result, the guided modes that are converted as a function of the incident angles of the light fluxes that enter the waveguide can be controlled and the light fluxes can be selectively guided to different photoelectric conversion sections according to the incident angles of the light fluxes. Each of the ranging pixels 104 and 105 has a pupil division feature in the x-direction so that a light flux from right side area 120Ra of the exit pupil 120 is guided to the photoelectric conversion section 110, while a light flux from left side area 120La of the exit pupil is guided to the photoelectric conversion section 111. Additionally, with regard to the ranging pixels 104, 105, the rays of light that enter a ranging pixel with a particularly large angle and is propagated through the waveguide of the pixel can be attenuated by forming an attenuating member 113 so as to represent an appropriate shape by using an appropriate medium and arranging the attenuating member 113 at an appropriate position in the pixel. Furthermore, light fluxes can be guided to particular photoelectric conversion sections more selectively. The light fluxes that get to the photoelectric conversion sections 110 and 111 are transformed into electrons and output to a signal processing circuit (not illustrated). A highly accurate ranging operation can be realized by detecting images of light fluxes that pass through different pupil areas by means of a plurality of photoelectric conversion sections 110 and 111 and outputting ranging signals for a subject by means of a known technique to detect the distance to the subject.

(Reason Why Pupil Division Performance Improves)

The reason why the ranging accuracy is improved by arranging an attenuating member 113 in the clad 108 located at the center side of the imaging device 102 of each of the ranging pixels 104, 105 according to the present invention including this embodiment will be described below. As illustrated in FIG. 1A, principal ray 121 is inclined to the direction of the optical axis (z-axis) (which is also the direction of the normal to the imaging device) in peripheral sections of the imaging device 102. Referring to FIG. 2B, light flux 120Rb from the right side area 120Ra enters the ranging pixel 104 with a large angle relative to the optical axis. The angle is larger for ranging pixels arranged at and near the periphery. Light flux 120Lb from the left side area 120La, on the other hand, enters the ranging pixel 104 with a small angle because it is located close to the optical axis (running in the z-direction). The transmission mode of the light flux 120Rb is converted into guided mode 130 of the waveguide 106 and propagated through the waveguide while the transmission mode of the light flux 120Lb is converted into guided mode 131 and propagated through the waveguide.

As for light flux 120Rb that enters the ranging pixel with a large incident angle, the isosurface thereof is inclined and enters the ranging pixel at the light receive end facet 114 in a topologically uneven state. The light flux that enters the ranging pixel is apt to be bound to higher order eigenmodes of the waveguide 106 and the guided mode 130 becomes a mode that includes higher order eigenmodes. Generally, an electric field of higher order eigenmodes spreads in the waveguide and the ratio of the electric field included in the core 107 is low if compared with lower order eigenmodes so that the ratio of the electric field that leaks into the clad 108 is high. For this reason, such an electric field is liable to be influenced by the attenuating member 113 arranged at the clad 108 and part of the rays of light (indicated by dotted lines as example) in the waveguide mode 130 is attenuated. As the attenuating member 113 is arranged at the center side of the imaging device 102, the rays of light that enters the photoelectric conversion section 111 arranged at the center side are attenuated. Thus, the light flux 120Rb can be guided to the photoelectric conversion section 110 more selectively if compared with an instance where no attenuating member 113 is arranged.

The light flux 120Lb, on the other hand, enters the ranging pixel at the light receive end facet 114 with a small incident angle in a state where the phase is topologically substantially even. The light flux that enters the ranging pixel is apt to be bound to lower order eigenmodes of the waveguide 106 in a state where the phase is topologically even and the guided mode 130 becomes a mode that includes lower order eigenmodes to a large extent. Generally, with regard to an electric field of lower order eigenmodes, the ratio of the electric field included in the core 107 is high if compared with an electric field of higher order eigenmodes and can leak into the clad 108 only at a low ratio. For this reason, such an electric field is hardly liable to be influenced by the attenuating member 113 arranged at the clad. Thus, the light flux 120Lb is guided to the photoelectric conversion sections 110 and 111 at a ratio similar to the ratio observed in an instance where no attenuating member 113 is provided.

Due to the above-described advantageous effects, the light fluxes 120Rb and 120Lb that pass through different respective areas on the exit pupil can be guided to the photoelectric conversions sections 110 and 111 more selectively if compared with an instance where no attenuating member 113 is provided. Thus, a highly accurate ranging operation can be realized by detecting images of light fluxes that pass different pupil areas by means of a plurality of photoelectric conversion sections 110 and 111 in this way and outputting signals for ranging a subject by means of a known technique in order to detect the distance to the subject. A ranging operation can also be realized highly accurately by means of ranging pixels 105 on the same principle. Additionally, by exploiting the characteristic that the guided mode varies in a waveguide, light fluxes that pass different pupil areas are guided to different corresponding photoelectric conversion sections so that ranging operations can be conducted highly accurately if pixels are particularly small.

(Other Advantages: When Imaging Optical System is Zoom Optical System)

The arrangement of the present invention allows a zoom optical system in which the exit pupil position varies as a function of the state of zoom to conduct ranging operations highly accurately regardless of the state of the optical system. As the exit pupil is moved away, light fluxes enter the ranging pixels with small incident angles. As described above, the transmission modes of such light fluxes are converted into respective guided modes that include lower order eigenmodes and then the light fluxes are propagated through the waveguides so that the light fluxes are hardly liable to be influenced by attenuating members 113. As a result, light fluxes that pass through different pupil areas can be guided to different respective photoelectric conversion sections for ranging operations with a degree of accuracy similar to the one that is achieved when no attenuating members are provided. When the exit pupil is located closer, principal rays are inclined and the number of light fluxes that enter respective pixels with a large incident angle increases. In such an instance, however, ranging operations can be conducted highly accurately for the above-described reason.

(Effects)

Figure 3:
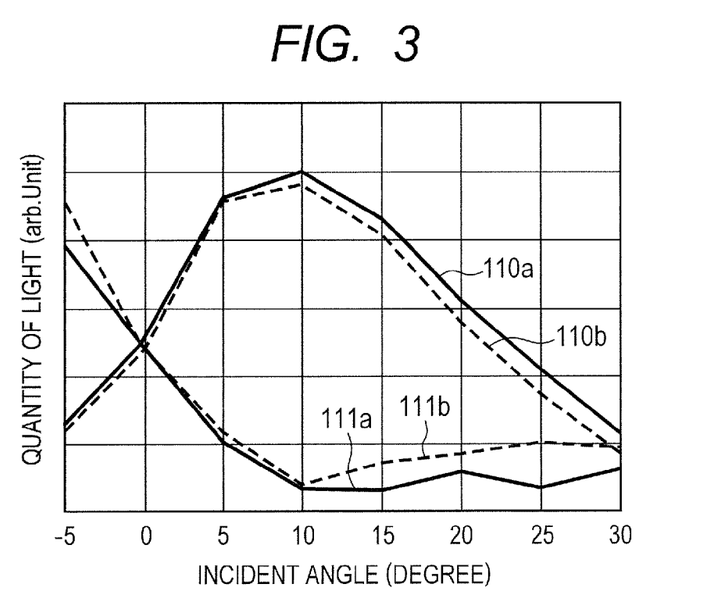
FIG. 3 is a graph illustrating the incident angle dependence of the quantity of light detected by the ranging pixels 104 of the first embodiment.

FIG. 3 is a graph illustrating the incident angle dependence of light that is propagated through the waveguide 106 of the ranging pixel 104 and made to enter the areas where photoelectric conversion sections are arranged. In the graph of FIG. 3, the horizontal axis represents the incident angle of incident light and the vertical axis represents the quantity of light made to enter each of the areas where the photoelectric sections 110 and 111 are arranged. In the graph, solid lines 110, 111$a$ indicate instances where the attenuating members 113 are provided, while broken lines 110$b$, 111$b$ indicate instances where the attenuating members 113 are not provided. As seen from the graph, as a result of arranging the attenuating members 113, the quantity of light that is selectively made to enter the area where the photoelectric conversion section 110 is arranged can be increased for a light flux that enters the ranging pixel 104 with a large angle (e.g., +20 degrees or so).

Referring to FIG. 2B, part of light that is being propagated in guided mode 130 is actually propagated in an area located adjacent to scattering section 112 at the −x side and made to enter an area where the photoelectric conversion section 110 is arranged. On the other hand, part of the light that is propagated in an area adjacent to the scattering section 112 at the +x side leaks out into the clad section 108, reflected by the attenuating member 113 and attenuated. As a result, the quantity of light that is made to enter an area where the photoelectric conversion section 111 is arranged decreases. Light fluxes from an area at the left side (0 degrees or so) are influenced only to a small extent by attenuating members and made to enter respective corresponding photoelectric conversion sections by a ratio that is substantially the same as the ratio by which they are made to enter photoelectric conversion sections when no attenuating members are provided. This means that, in FIG. 2B, light that is being propagated in guided mode 131 is influenced by the attenuating member 113 only to a small extent and made to enter areas where the photoelectric conversion sections 110 and 111 are arranged substantially without losing any part of its quantity. The above-described principle also applies to the ranging pixel 105 illustrated in FIG. 2C except that the left side and the right side are inverted.

Above description clearly tells that light fluxes entering a ranging pixel from different pupil areas can be guided to different corresponding photoelectric conversion sections more selectively than ever in a ranging condition where incident light includes a large number of light fluxes entering the imaging device with a large angle.

(Attenuating Member: Arranged at Position Held in Contact with Core)

According to the present invention including this embodiment, an attenuating member 113 is arranged in the clad 108 of a waveguide 106 of a ranging pixel desirably at a position located close to the core 107. An electric field of higher order eigenmodes abruptly attenuates in the clad 108 as the distance from the boundary of the core 107 and the clad 108 increases. The above effect can be achieved more effectively by arranging an attenuating member 113 at a position that can be influenced by an electric field of higher order eigenmodes. Therefore, an attenuating member 113 is desirably arranged at a position as close as possible to the boundary of the core 107 and the clad 108. More specifically, an attenuating member 113 is desirably arranged at a position in the clad 108 of a waveguide 106 that is located within the wavelength of light to be detected from the boundary of the core 107 and the clad 108. More desirably, an attenuating member 113 is arranged at a position in the clad 108 that is held in contact with the boundary of the core 107 and the clad 108 (and hence at a position that is held in contact with the core). With this arrangement, the above-described effect of an attenuating member 113 can be exploited more effectively.

(Attenuating Member: Arranged at Waveguide Lower End)

The electric field of light that is propagated through a waveguide 106 and made to enter a substrate 109 is determined as a function of the electric field distribution at the light exit end 115 of the waveguide 106. The quantity of light that is made to enter an area where a photoelectric conversion section 111 is arranged decreases as the electric field at a position of the light exit end 115 that is located close to the photoelectric conversion section 111 is smaller. By arranging an attenuating member 113 in an area of the clad located close to the photoelectric conversion section 111 that is found near the light exit end 115 to attenuate the electric field in that area, light of higher order eigenmodes that enters the photoelectric conversion section 111 can effectively be attenuated. More desirably, an attenuating member 113 is arranged in the clad at the level of the light exit end 115 of the waveguide 106. The quantity of light that enters the photoelectric conversion section 111 at an appropriate position can be increased by arranging an attenuating member 113 at the level of the light exit end 115. An attenuating member may be arranged at a part of the clad located above the photoelectric conversion section.

(Attenuating Member: Medium)

For the purpose of the present invention including this embodiment, the medium that constitutes an attenuating member 113 is not limited to those described above as examples for this embodiment. Examples of other mediums include metal mediums, semiconductors and insulators that are different from the above-described mediums. Alternatively, a scattering medium that scatters and reflects or absorbs at least part of light of the wavelength band to be detected may be employed. Examples of such mediums that can be used for an attenuating member include Al and W. The above-described effect of an attenuating member 113 can be exploited more effectively by using any of the above listed mediums so as to make it reflect or absorb and attenuate part of light being propagated through a waveguide 106.

(Attenuating Member: Material Different from Wiring)

For the purpose of the present invention including this embodiment, an attenuating member 113 is a member that is made of a material different from the material of the wiring for transmitting the signals acquired at photoelectric conversion sections (a material that attenuates incident light to a different extent, preferably a material that attenuate incident light to an extent greater than the material of the wiring). As light enters the wiring, part of the light that enters is converted into an electric charge, which is then transmitted through the wiring. Such an electric charge becomes noise relative to the signals that are transmitted through the wiring to consequently degrade the quality of the signals. Therefore, the attenuating member 113 and the wiring are desirably arranged as members of different materials. Then, degradation of the quality of signals can be prevented from taking place.

(Effect of Scattering Section)

With regard to ranging pixels 104 and 105 according to the present invention including this embodiment, the effect of arranging an attenuating member 113 as described above can be exploited more effectively by providing each of the ranging pixels with a scattering section 112 and arranging an attenuating member 113 at a part of the clad 108 that is located adjacent to the core 107 in which a scattering section 112 is arranged. As a scattering section 112 is arranged, the area of the core 107 of the waveguide is narrowed and reduced. Then, light that is being propagated through the waveguide is confined to such a narrow area so that the maximum electric field intensity in the core is increased and the electric field that leaks into the clad 108 is also intensified. For this reason, the guided mode can be attenuated to a greater extent by the attenuating member 113 arranged in the clad 108 at a position located near the core 107 so that the above-described effect of the attenuating member 113 can be exploited more effectively.

If the width of the scattering section 112 is too narrow relative to the wavelength of light to be detected, the scattering section 112 cannot influence the guided mode. If, on the other hand, the width of the scattering section 112 is too broad, part of light is reflected or scattered to give rise to lost light. Desirably, the width of the scattering section 112 is between about 0.1 times and about 2 times of the wavelength of light to be detected. The width of the area of the core 107 located at each of the opposite sides of the scattering section 112 is desirably equal to the width of the multimode waveguide in which a plurality of eigenmodes exist relative to light to be detected by a corresponding photoelectric conversion section. Light can be attenuated to a large extent by an attenuating member 113 by making the area include a large number of higher order eigenmodes and causing light to be propagated in a guided mode with which an electric field is apt to spread into the clad 108. For this reason, the width of the part of the core 107 located at each of the opposite sides of the scattering section 112 is preferably between about 0.1 times and about 2 times, more preferably between about 0.5 times and about 1.5 times, of the wavelength of light to be detected.

The height of a scattering section 112 is desirably not less than one tenth of the wavelength of light to be detected. By employing such a height for a scattering section 112, light can be made to be propagated through areas located at the opposite sides of the scattering section 112 to effectively exploit the effect of the corresponding attenuating member 113.

(Arrangement of Ranging Pixels)

Any area or all the area of an imaging device 102 according to the present invention including this embodiment can be used for ranging operations when ranging pixels are employed for all the pixels of the imaging device 102. Then, the signals acquired by the photoelectric conversion sections 110 and 111 in the pixels can be added so as to be utilized as image signal of the picked up image of a subject formed by the imaging optical system.

For the purpose of the present invention including this embodiment, the manner of arrangement of ranging pixels 104 and 105 on an imaging device 102 as described above is not limited to the that of this embodiment. For instance, ranging pixels 104 and 105 may be arranged for all the pixels of the imaging device 102. Light fluxes from the exit pupil 120 enter the ranging pixels 104 and 105 that are arranged at and near the center with a shallow angle. For the above-described reason, the transmission modes of such light fluxes are converted into guided modes that include a large number of lower order eigenmodes and light fluxes are propagated through related waveguides 106 in such modes so that they are hardly influenced by attenuating members 113. Therefore, ranging operations can be conducted at a level of accuracy substantially the same as the level of accuracy that is achieved when no attenuating members 113 are provided. However, when a very light imaging optical system is employed, light fluxes that pass through peripheral sections of the exit pupil enter ranging pixels with a large angle so that the number of light fluxes that enter ranging pixels with a large angle increases even in a center section of the imaging device. Even in such ranging conditions, light fluxes from different pupil areas can effectively be acquired at different corresponding photoelectric conversion sections due to the ranging pixels 104 and 105 arranged at and near the center of the imaging device so that the imaging device can conduct accurate ranging operations.

Figure 4:
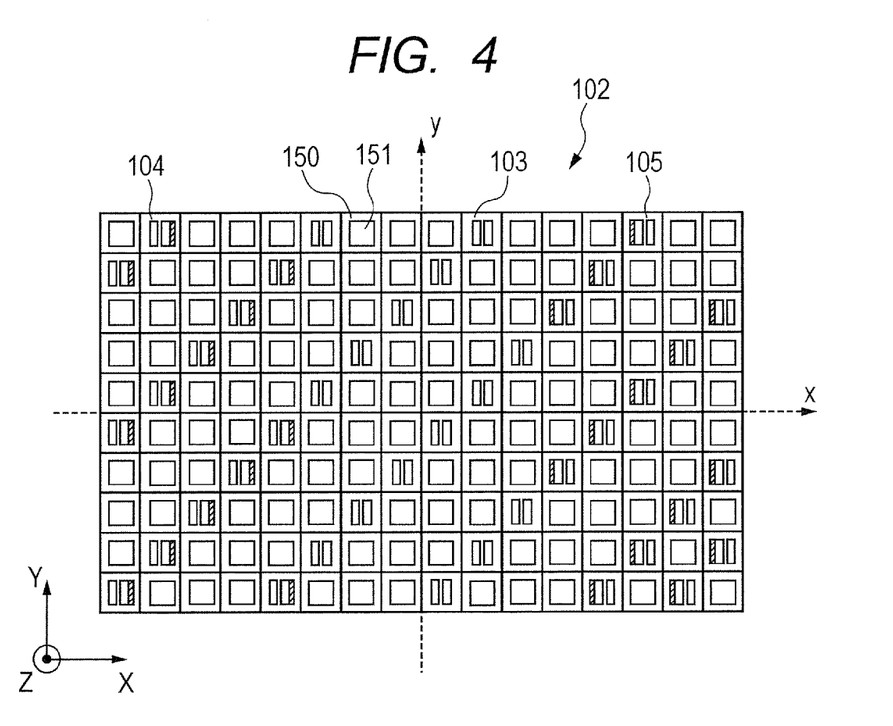
FIG. 4 is a schematic plan view of the imaging device of the first embodiment, illustrating an exemplar configuration thereof.

Alternatively, the ranging pixels 103, 104 and 105 may be arranged in a distributed manner and imaging pixels 150 may be arranged to fill the gaps as illustrated in FIG. 4. An imaging pixel 150 is a pixel that has a single photoelectric conversion section 151 in the pixel. With this arrangement, the imaging device executes a ranging operation, using the signals acquired by the ranging pixels, and generates an image, using the signal acquired by the imaging pixels 150. Alternatively, imaging signals for the ranging pixels that are located nearby may be generated by using the signals acquired by the imaging pixels. With such an arrangement, the ratio of ranging pixels relative to all the pixels that an imaging device 102 has can be reduced and the imaging device can pick up a high quality image while executing an accurate ranging operation.

Figure 5A:
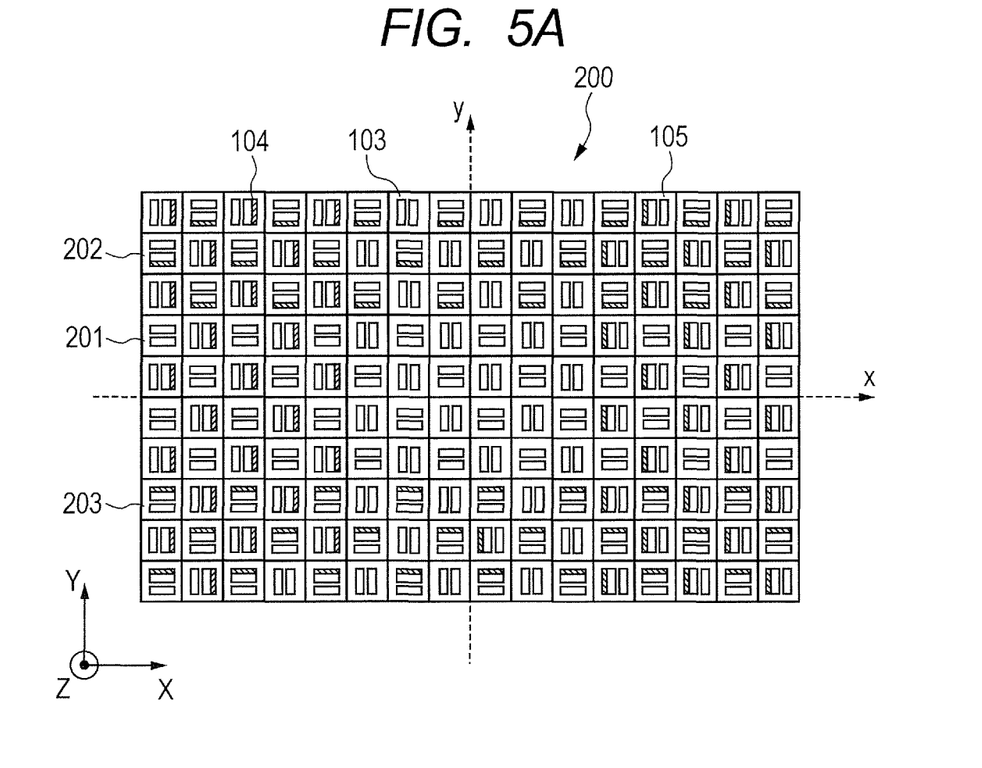
FIG. 5A is a schematic illustration of another exemplar configuration of the imaging device of the first embodiment.
Figure 5B:
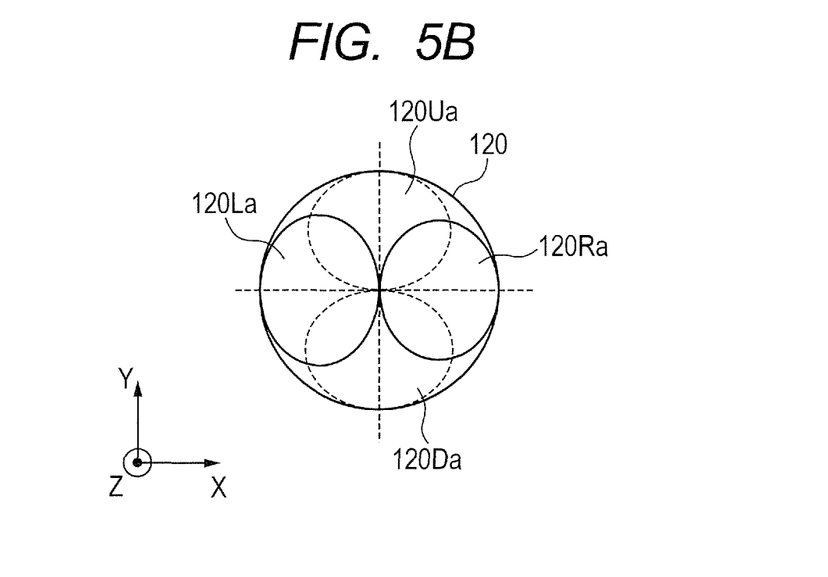
FIG. 5B is a schematic plan view of a plurality of pupil areas in the exit pupil.
Figure 6A:
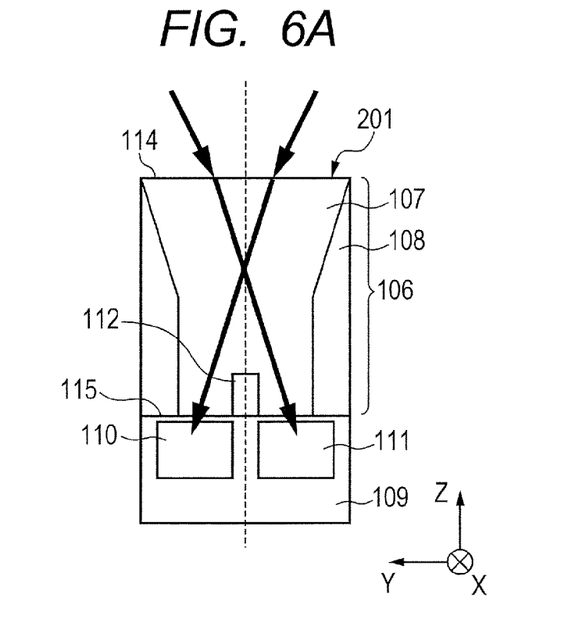
FIGS. 6A, 6B and 6C are schematic cross-sectional views of other ranging pixels contained in the imaging device of the first embodiment.
Figure 6B:
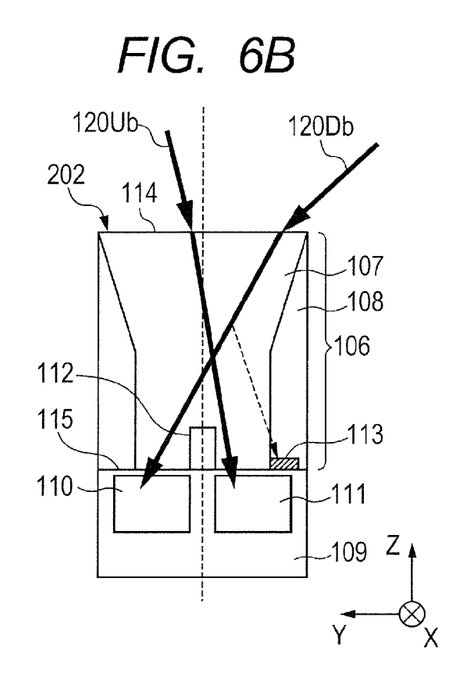
Figure 6C:
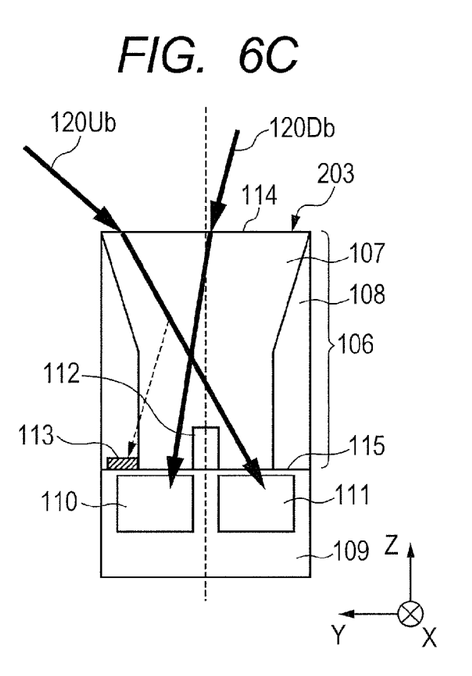

Still alternatively, a plurality of ranging pixel having a pupil division feature may be arranged in imaging device 200 both in the x-direction and in the y-direction as illustrated in FIG. 5A. As seen from FIG. 5A, photoelectric conversion sections are arranged at positions that are shifted in the x-direction in ranging pixels 103, 104, 105, whereas photoelectric conversion sections are arranged at positions that are shifted in the y-direction in ranging pixels 201, 202, 203. Pixels are arranged in rows both in the x-direction and in the y-direction. The ranging pixels 104, 105 are arranged as peripheral pixels of the imaging device in the x-direction, while the ranging pixels 202, 203 are arranged as peripheral pixels of the imaging device in the y-direction.

As illustrated in FIGS. 2A through 2C and 6A through 6C, each ranging pixel is formed by using a waveguide and other components. As illustrated in FIGS. 5B and 6A through 6C, the ranging pixels 201, 202, 203 acquire light fluxes 120Ub, 120Db from areas 120Ua and 120Da of exit pupil 120 that are displaced from each other in the y-direction. As illustrated in FIGS. 5B and 2A through 2C, the ranging pixels 103, 104, 105 acquire light fluxes 120Rb, 120Lb from areas 120Ra and 120La of the exit pupil 120 that are displaced from each other in the x-direction. With this arrangement, a subject whose contrast varies in the x-direction can be ranged by the ranging pixels 103, 104, 105, while a subject whose contrast varies in the y-direction can be ranged by the ranging pixels 201, 202, 203.

In each of the ranging pixels 104 and 105, an attenuating member 113 is arranged at the center side of the imaging device 102 as viewed in the x-direction that is a pupil division direction, whereas in each of the ranging pixels 202 and 203, an attenuating member 113 is arranged at the center side of the imaging device 102 as viewed in the y-direction that is a pupil division direction. With this arrangement, light fluxes coming from different pupil areas can be selectively guided to different corresponding photoelectric conversion sections due to the above-described effect of the attenuating member 113 in a condition where incident light includes a large number of light fluxes entering the imaging device with a large angle both in the x-direction and in the y-direction. Additionally, a subject whose contract varies in the x-direction and/or y-direction can be ranged highly accurately.

The number and the positions of arrangement of photoelectric conversion sections and the number and the positions of arrangement of scattering sections are not limited to those described above for this embodiment. For example, two photoelectric conversion sections may be arranged longitudinally and two photoelectric conversion sections may be arranged transversally in each ranging pixel (to make the total number of photoelectric conversion sections in each ranging pixel equal to four). A cross-shaped scattering section may be arranged to divide the core both longitudinally and transversally. With this arrangement, longitudinal and transversal incident lights can be separated from each other. A subject whose contrast varies both in the longitudinal direction and in the transversal direction can be ranged by using the signals acquired at those photoelectric conversion sections. Alternatively, three or more than three photoelectric conversion sections may be arranged longitudinally or transversally in each pixel and a scattering section may be provided to separate the photoelectric conversion sections. The exit pupil can be divided more minutely with such an arrangement and ranging operations can be conducted further accurately by using the signals acquired at the photoelectric conversion sections.

(Tapered Core: Arrangement of ML, CF)

For the purpose of the present invention including this embodiment, the core 107 of the waveguide of each ranging pixel desirably represents a tapered profile such that its diameter increases toward the light receive end of the waveguide. As the core is made to represent a tapered profile, all the light fluxes striking the entire surface of the light receive end of the pixel can effectively be guided to the core 107 of the waveguide and the quantity of light that is made to strike the substrate 109 can be increased. Additionally, as the core is made to represent a tapered profile, a space can be secured to arrange wiring for extracting electric signals in each clad 108 disposed between pixels, although not-illustrated in FIGS. 2 and 6. Additionally, the area where light is propagated can be limited to a specific area in each pixel so as to reduce cross talks that arise as light leaks to neighboring pixels.

Figure 7A:
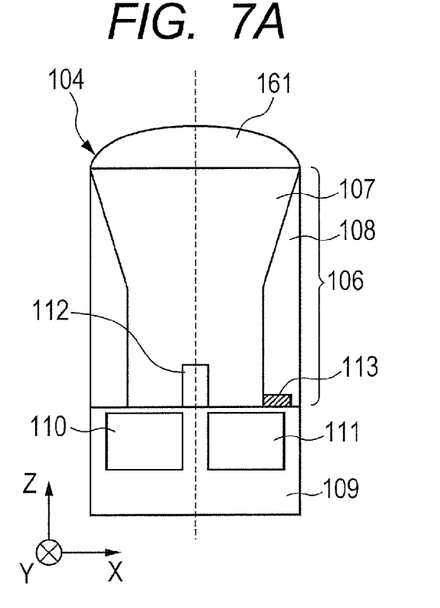
FIGS. 7A and 7B are schematic cross-sectional views of still other ranging pixels contained in the imaging device of the first embodiment.
Figure 7B:
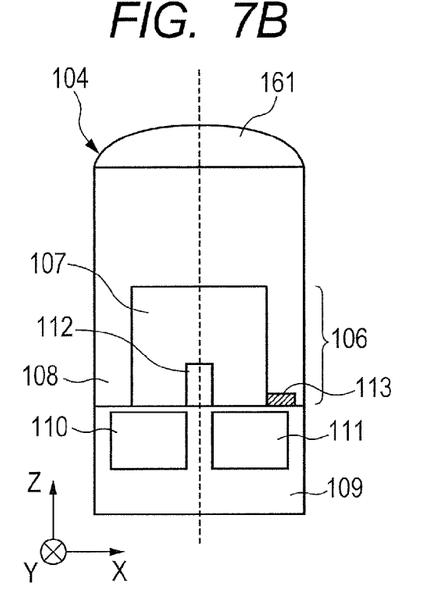

Alternatively, a micro lens 161 may be arranged on the waveguide 106 of each ranging pixel as illustrated in FIGS. 7A and 7B. As the micro lens 161 is arranged there, light can be made to mainly enter the core 107 of the ranging pixel. Additionally, the angle limits can be narrowed for the light fluxes entering a ranging pixel. Then, the quantity of light can be increased for each light flux that is to be guided to a photoelectric conversion section. Additionally, each pixel may be provided with a color filter. Then, limits can be set to the wavelength band for light entering a waveguide so that incident light can be propagated in a desired guided mode with ease and hence light fluxes from different pupil areas can be guided more selectively to different corresponding photoelectric conversion sections. As illustrated in FIG. 7B, a transparent section can be arranged between the micro lens 161 and waveguide 106. In FIG. 7B, the micro lens 161 is so arranged that the focal point of the micro lens 161 is found at the light receive end of the waveguide 106.

(Imaging System)

Figure 8:
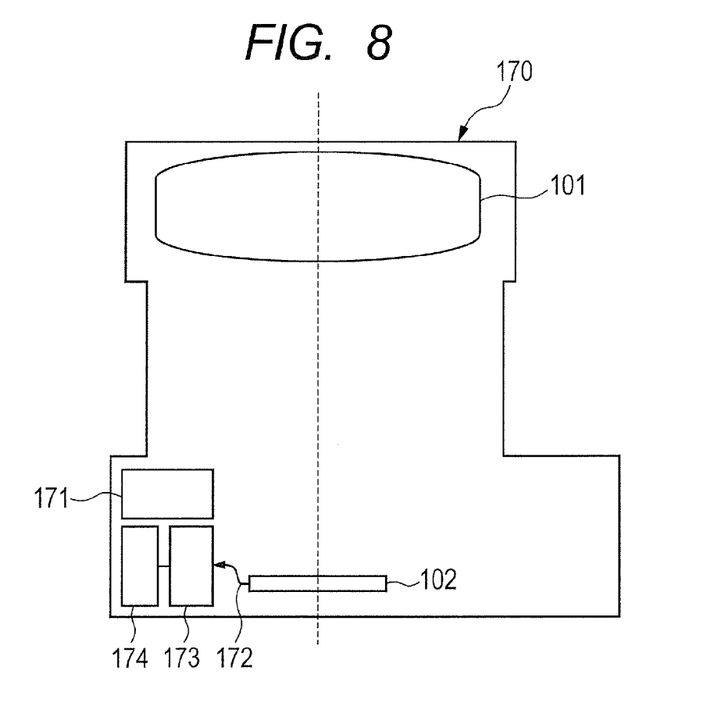
FIG. 8 is a schematic cross-sectional view of an imaging apparatus of the first embodiment, illustrating the imaging system thereof.

As illustrated in FIG. 8, an imaging system can be formed by using a ranging device 100 that includes an imaging optical system 101 and an imaging device 102, a CPU 171 that controls the ranging device 100 and wiring 172, a signal processing substrate 173 and a recording device 174 for reading out, processing and recording the signals acquired by the imaging device 102. With this arrangement, an image of a subject formed by the imaging optical system 101 can be acquired simultaneously with a ranging operation.

As described above, light fluxes that enter a ranging pixel can effectively be separated according to the incident angles thereof by arranging a waveguide and a plurality of photoelectric conversion sections in the pixel and appropriately defining the profile, the medium and the positions of arrangement of the waveguide. Furthermore, light fluxes that enter the pixel with a particularly large angle can be selectively guided to appropriate corresponding photoelectric conversion sections by arranging an attenuating member in the clad of the waveguide of the ranging pixel at the center side of the imaging device as viewed in the pupil division direction (more generally, at the side opposite to the photoelectric conversion section for receiving a light flux that enters the ranging pixel with a large angle as described earlier). Then, as a result, a ranging device that can conduct accurate ranging operations can be realized.

An imaging device according to the present invention that is described above can find applications in ranging devices and imaging apparatus that require a ranging device, such as a digital camera. When using an imaging device according to the present invention, the position of the imaging device may be appropriately determined relative to the optical system for forming an image of a subject according to the configuration of the imaging device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-200133, filed Sep. 12, 2012, which is hereby incorporated by reference herein in its entirety.

What is claimed is:

1. An imaging device comprising a plurality of pixels configured to receive light fluxes from an exit pupil of an optical system for forming an image of a subject and operate for photoelectric conversion, the imaging device comprising:

the plurality of pixels and a plurality of ranging pixels, each of the ranging pixels having a plurality of photoelectric conversion sections configured to receive respective light fluxes from a plurality of pupil areas displaced from each other in the exit pupil and operating for photoelectric conversion;

each of the ranging pixels comprises a waveguide having a core and a clad for guiding the light fluxes to the respective photoelectric conversion sections, the core having a higher refractive index than that of the clad;

the plurality of ranging pixels including first ranging pixels having an attenuating member arranged outside of the core and in the clad, each of said attenuating members being located closer to the center side of the imaging device than the core as viewed in the pupil division direction; and a scattering section arranged at the light exit side of the core of each of the first ranging pixels and the attenuating member of the pixel is arranged in the clad at a level of the light exit end of the core, wherein a width of the scattering section is between 0.1-2 times the wavelength of the light to be detected.

2. The device according to claim 1, wherein the attenuating member is held in contact with the core in each of the first ranging pixels.

3. The device according to claim 1, wherein the attenuating member is arranged at the lower end of the light exit end of the waveguide in each of the first ranging pixels.

4. The device according to claim 1, wherein the attenuating member of each of the first ranging pixels is made of a medium that reflects at least part of light having the wavelength band to be detected.

5. The device according to claim 1, wherein the attenuating member of each of the first ranging pixels is made of a medium that absorbs at least part of light having the wavelength band to be detected.

6. The device according to claim 1, wherein the attenuating member of each of the first ranging pixels is made of a medium that scatters at least part of light having the wavelength band to be detected.

7. The device according to claim 1, wherein each of the pixels has a wiring section that is electrically linked to the photoelectric conversion sections of the pixel and the attenuating members of the first ranging pixels are made of a material representing a degree of light attenuation that is different from the degree of light attenuation of the wiring sections.

8. The device according to claim 1, wherein the first ranging pixels are arranged in a peripheral section of the imaging device as viewed in the pupil division direction on the imaging device that corresponds to the displacement direction of the pupil areas.

9. The device according to claim 1, wherein the plurality of ranging pixels further include second ranging pixels, and the second ranging pixels are arranged in a center section of the imaging device and the second ranging pixels do not have any attenuating member.

10. The device according to claim 1, wherein the attenuating member of each of the first ranging pixels is arranged only at the clad located at the side where the principal ray of the light flux that enters the ranging pixel is located as viewed in the pupil division direction on the ranging pixel.

11. An imaging apparatus comprising:

an imaging device according to claim 1; and an optical system for forming an image of a subject on the imaging device.

12. The device according to claim 1, wherein a width of the part of the core located at each of the opposite sides of the scattering section is 0.1-2 times the wavelength of the light to be detected.

13. The device according to claim 12, wherein a width of the part of the core located at each of the opposite sides of the scattering section is 0.5-1.5 times the wavelength of the light to be detected.

* * * * *